(12) United States Patent
Bleidistel et al.

(10) Patent No.: US 10,578,976 B2
(45) Date of Patent: *Mar. 3, 2020

(54) CATADIOPTRIC PROJECTION OBJECTIVE INCLUDING A REFLECTIVE OPTICAL COMPONENT AND A MEASURING DEVICE

(71) Applicant: Carl Zeiss SMT GmbH, Oberkoch (DE)

(72) Inventors: Sascha Bleidistel, Aalen (DE); Toralf Gruner, Aalen-Hofen (DE); Christoph Zaczek, Heubach (DE); Ralf Mueller, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/207,460

(22) Filed: Dec. 3, 2018

(65) Prior Publication Data

US 2019/0101832 A1 Apr. 4, 2019

Related U.S. Application Data

(63) Continuation of application No. 13/423,344, filed on Mar. 19, 2012, now Pat. No. 10,146,137, which is a
(Continued)

(30) Foreign Application Priority Data

Oct. 28, 2009 (DE) ........................ 10 2009 046 098

(51) Int. Cl.
*G03F 7/20* (2006.01)
*G02B 13/14* (2006.01)
*G02B 17/08* (2006.01)

(52) U.S. Cl.
CPC ....... *G03F 7/70258* (2013.01); *G02B 13/143* (2013.01); *G02B 17/0856* (2013.01);
(Continued)

(58) Field of Classification Search
CPC ............. G03F 7/70225; G03F 7/70725; G03F 7/70958; G03F 7/7085
See application file for complete search history.

(56) References Cited

U.S. PATENT DOCUMENTS 5,673,102 A 9/1997 Suzuki
5,900,926 A * 5/1999 Kato .................... G03F 7/70225
250/548

(Continued)

FOREIGN PATENT DOCUMENTS

DE 103 18 583 A1 11/2004
DE 10 2009 030 230.1 12/2010
(Continued)

OTHER PUBLICATIONS

The International Search Report and a Written Opinion from the counterpart PCT Application No. PCT/EP2010/064380, dated Jan. 25, 2011.
(Continued)

*Primary Examiner* — Steven Whitesell Gordon
(74) *Attorney, Agent, or Firm* — Fish & Richardson P.C.

(57) ABSTRACT

A catadioptric projection objective for images an object field onto an image field via imaging radiation. The projection objective includes at least one reflective optical component and a measuring device. The reflective optical component, during the operation of the projection objective, reflects a first part of the imaging radiation and transmits a second part of the imaging radiation. The reflected, first part of the imaging radiation at least partly contributes to the imaging of the object field. The transmitted, second part of the
(Continued)

imaging radiation is at least partly fed to a measuring device. This allows a simultaneous exposure of the photosensitive layer at the location of the image field with the imaging radiation and monitoring of the imaging radiation with the aid of the measuring device.

20 Claims, 7 Drawing Sheets

Related U.S. Application Data continuation of application No. PCT/EP2010/064380, filed on Sep. 28, 2010.

(52) U.S. Cl.
CPC ......... *G02B 17/0892* (2013.01); *G03F 7/706* (2013.01); *G03F 7/70225* (2013.01)

(56) References Cited

U.S. PATENT DOCUMENTS

| | | | |
|---|---|---|---|
| 6,040,894 A | 3/2000 | Takahashi | |
| 6,084,706 A * | 7/2000 | Tamkin | G02B 26/12 359/208.1 |
| 6,335,787 B1 | 1/2002 | Nishi | |
| 6,545,746 B1 * | 4/2003 | Nishi | G03F 7/70891 355/30 |
| 7,112,772 B2 * | 9/2006 | Wagner | G02B 17/08 250/201.9 |
| 10,146,137 B2 * | 12/2018 | Bleidistel | G02B 13/143 |
| 2004/0188627 A1 * | 9/2004 | Panning | B82Y 10/00 250/372 |
| 2005/0173647 A1 * | 8/2005 | Bakker | G03F 7/70558 250/372 |
| 2008/0151221 A1 | 6/2008 | Sogard | |
| 2009/0185153 A1 * | 7/2009 | Epple | G03F 7/70225 355/67 |
| 2012/0218536 A1 | 8/2012 | Bleidistel et al. | |

FOREIGN PATENT DOCUMENTS

| | | |
|---|---|---|
| JP | H6-20925 A2 | 1/1994 |
| JP | H9-106077 | 4/1997 |
| JP | H9-246139 | 9/1997 |
| WO | WO 2004/019128 | 3/2004 |
| WO | WO 2010/149436 | 12/2010 |

OTHER PUBLICATIONS

Japanese Office Action, with translation thereof, for corresponding JP Appl No. 2012-535717, dated Aug. 1, 2013.

* cited by examiner

CATADIOPTRIC PROJECTION OBJECTIVE INCLUDING A REFLECTIVE OPTICAL COMPONENT AND A MEASURING DEVICE

CROSS-REFERENCE TO RELATED APPLICATIONS

This application is a continuation of, and claims benefit under 35 USC 120 to, U.S. application Ser. No. 13/423,344, filed Mar. 19, 2012, now U.S. Pat. No. 10,146,137, which is a continuation of, and claims benefit under 35 USC 120 to, international application PCT/EP2010/064380, filed Sep. 28, 2010, which claims benefit under 35 USC 119 of German Application No. 10 2009 046 098.5, filed Oct. 28, 2009. U.S. application Ser. No. 13/423,344 and international application PCT/EP2010/064380 are hereby incorporated by reference in their entirety.

FIELD

The disclosure relates to a catadioptric projection objective for imaging an object field onto an image field, which objective includes a reflective optical component and a measuring device. The disclosure also relates to a microlithography projection exposure apparatus including such a catadioptric projection objective, and to a method for measuring the intensity of imaging radiation at the location of a reflective optical component within such a catadioptric projection objective.

BACKGROUND

Microlithography projection exposure apparatuses are used to produce microstructured components using a photolithography method. In this case, a structure-bearing mask, the so-called reticle, is illuminated using an illumination system and imaged onto a photosensitive layer using a projection optical unit. In this case, the minimum feature size, that is to say the resolution which can be imaged with the aid of such a projection optical unit, is determined by various factors. Firstly, the resolution is related to the wavelength of the imaging light used, in which case the smaller the wavelength of the imaging light used, the smaller the structures that can be imaged. Furthermore, the larger the numerical aperture of the imaging light at the location of the photosensitive layer, the greater the resolution.

In order to ensure this quality of the imaging, however, it is desirable for the image errors of the projection objective to be sufficiently small. This means, for example, that the wavefront aberrations of the projection objective are of the order of magnitude of a few milli-lambda (m$\lambda$), where $\lambda$ is the wavelength of the imaging light used. During the operation of the microlithography projection exposure apparatus, however, various effects occur which can adversely influence the wavefront aberrations of the projection objective. Thus, e.g., various lens materials such as e.g. quartz or flint glasses, exhibit damage in the form of material compaction on account of the permanent irradiation. Stresses are thereby induced in the lens, which can lead to stress birefringence. Furthermore, all optical components, such as mirrors and lenses, have a certain residual absorption, which has the consequence that the optical elements are heated during the operation of the projection objective. This can cause a deformation of the optical elements and also a change in the refractive index due to the resulting material expansion. All these effects lead to an alteration of the wavefront aberrations of the projection objective, such that the imaging quality is adversely influenced. For this reason, a projection objective generally includes a multiplicity of correction mechanisms, such as, e.g., displaceable or tiltable optical elements, with which such system alterations can be compensated. In order to drive these correction mechanisms, however, it is desirable to measure the wavefront aberration of the projection objective very accurately. For this purpose, generally the exposure process is interrupted and, e.g., an interferometric measurement of the wavefront aberrations is performed. However, the interruption for measurement purposes can have the consequence that a smaller number of microstructured components can be produced in a certain unit of time. Furthermore, such a measuring method can have the disadvantage that the wavefront aberrations of the projection objective can change during the exposure of the photosensitive layer and this is only ascertained upon the next measurement interruption.

SUMMARY

The disclosure provides a catadioptric projection objective which includes a reflective optical component and a measuring device, such that the photosensitive layer can be exposed with imaging radiation simultaneously with monitoring the imaging radiation using a measuring device.

A catadioptric projection objective is used to image an object field onto an image field using imaging radiation. The objective includes at least one reflective optical component and a measuring device. The reflective optical component is arranged so that, during operation of the projection objective, the reflective element reflects a first part of the imaging radiation, and the reflective element transmits a second part of the imaging radiation. The reflected, first part of the imaging radiation at least partly contributes to the imaging of the object field. The transmitted, second part of the imaging radiation is at least partly fed to a measuring device. In addition, the transmitted, second part of the imaging radiation amounts to less than 10% of the imaging radiation impinging on the reflective optical component.

In one embodiment, the reflective optical component is arranged near the pupil. This has the advantage that the intensity distribution of the imaging radiation at the location of the reflective optical component substantially corresponds to the intensity distribution in a pupil plane.

In some embodiments, the reflective optical component within the projection objective is arranged near the field. This has the advantage that the intensity distribution of the imaging radiation at the location of the reflective optical component substantially corresponds to the intensity distribution in a field plane.

In certain embodiments, the reflective optical component has a curvature for producing a diverging, focusing or collimating effect. This has the advantage that a reflective optical component that is present anyway because of specific design stipulations in the projection objective can simultaneously be used for measuring the intensity distribution.

Catadioptric projection objectives are distinguished by the fact that concave mirrors are often used in order, among other things, to correct the image field curvature of the imaging. According to the disclosure, such a mirror can simultaneously also be provided with a measuring device, such that no additional reflective optical component is required.

In some embodiments, the catadioptric projection objective is configured in such a way that the transmitted, second part of the imaging radiation amounts to between 0.1% and 5% of the imaging radiation impinging on the reflective optical component. What is thereby achieved is that, on the one hand, a sufficient proportion of the imaging radiation can be measured with the aid of the measuring device and, on the other hand, the intensity of the imaging radiation in the image plane of the projection objective is not reduced all that much, and so the number of microstructured components which can be produced in a certain unit of time does not decrease significantly.

Supplementarily, the catadioptric projection objective can be embodied in such a way that the measuring device includes at least one component for the spatially resolved measurement of the intensity of the transmitted, second part of the imaging radiation. The spatially resolved measurement of the intensity allows a larger database for evaluating the system properties, such as material alteration and heating. Therefore, it is possible to better distinguish between different effects which affect the intensity distribution at the location of the reflective optical component.

In certain embodiments, the reflective optical component has one or a plurality of regions that are illuminated during use of the object, and, at each point of the illuminated region(s), a part of the imaging radiation is transmitted and fed to the measuring device.

In such embodiments, the entire illuminated region of the reflective optical component is detected with the aid of the measuring device. This has the advantage that there are no regions which are not monitored by the measuring device.

Alternatively, during the operation of the projection optical unit, the reflective optical component has one or more illuminated regions, and the illuminated region(s) has/have one or more partial regions, wherein, at each point of the partial region(s), a part of the imaging radiation is transmitted and fed to the measuring device and, at each point of the illuminated region(s) outside the partial region(s), the transmitted, second part of the imaging radiation is less than 0.5%. For many measurement purposes, it suffices to measure the imaging radiation in discrete partial regions, so this embodiment allows such a measurement simultaneously with high total reflectivity of the reflective optical component. In one specific configuration, the partial region(s) can also be developed in such a way that the imaging radiation is completely transmitted at each point of the partial region(s). This can be achieved, for example, by the partial region or the partial regions being embodied in the form of one or more holes.

In this case, the partial regions can be arranged for example in the form of a regular grid. For example, Cartesian grids or polar grids are possible. In this way, the measurement data can be extrapolated well to the region between the measured partial regions.

In a further embodiment of the catadioptric projection objective, the measuring device includes a measuring optical unit, which directs the transmitted, second part of the imaging radiation onto at least one radiation-sensitive sensor. The use of a measuring optical unit makes it possible to arrange the sensor for measuring the imaging radiation at a certain distance from the remaining components in order to be able to replace the sensor more simply as desired. In such a case, the measuring optical unit is embodied such that the distance is bridged. The use of a measuring optical unit has the further advantage that a distortion correction can be achieved with the aid of the measuring optical unit, such that the intensity distribution on the reflective optical component is well imaged onto the sensor. Furthermore, the position of the reflective optical component within the catadioptric projection objective can be compensated for with the aid of the measuring optical unit. Thus, it is particularly advantageous if the intensity distribution of the imaging radiation in a pupil plane of the catadioptric projection objective can be measured with the aid of the measuring device. This can be achieved particularly well when the reflective optical component is arranged near a pupil plane of the projection objective. However, if the projection optical unit is configured in such a way that the reflective optical component is not arranged near a pupil plane, then the measuring optical unit can be embodied in such a way that the sensor is nevertheless arranged near a pupil plane or an optically conjugate pupil plane. The same correspondingly holds true if the intensity distribution in a field plane of the catadioptric projection objective is intended to be measured by the measuring device according to the disclosure. In other words, even though the reflective optical component is not arranged near a field plane of the catadioptric projection objective, with a suitable embodiment of the measuring optical unit the sensor can nevertheless be arranged near a field plane or an optically conjugate field plane. In the case of such an embodiment, this likewise makes it possible to measure the intensity distribution in a field plane of the catadioptric projection objective.

Alternatively, the catadioptric projection objective can be developed in such a way that the measuring device includes at least one radiation-sensitive sensor which is directly connected to the reflective optical component, such that the transmitted, second part of the imaging radiation impinges on the at least one radiation-sensitive sensor without passing through further optical components between the reflective coating and the radiation-sensitive sensor. An absorption of the radiation to be measured within an intervening measuring optical unit can be avoided in this way.

In another design, the measuring device of the catadioptric projection objective includes a component that emits a secondary radiation upon passage or absorption of the transmitted, second part of the imaging radiation, wherein the secondary radiation has a different wavelength than the imaging radiation. What can thereby be achieved is that it is possible to use a sensor which has its maximum sensitivity in the range of the wavelength of the secondary radiation, rather than in the range of the wavelength of the imaging radiation.

In a further embodiment, the catadioptric projection objective includes a correction mechanism for correcting the imaging quality. This has the advantage that a good imaging can be ensured over a long period of time.

Possible correction mechanisms which can be used in a catadioptric projection objective include:

- alteration of the imaging wavelength by suitable modification of the light source, such as, for example, changing the pressure in the laser resonator, or modifying a spectral filter used;
- optical elements which are displaceable along the optical axis of the system;
- optical elements which are displaceable perpendicularly to the optical axis of the system;
- optical elements which are tiltable about an axis that is orthogonal to the optical axis of the system;
- non-rotationally symmetrically aspherized elements which are rotatable about the optical axis of the system (Alvarez manipulator);
- oppositely shaped optical elements displaceable relative to one another, preferably aspherized plane plates (Alvarez manipulator);
- deformable optical elements, in particular adaptive mirrors;

locally heatable and/or coolable optical elements, for example with the aid of infrared radiation;

globally heatable or coolable optical elements, such as, e.g., an immersion liquid;

alteration of the gas composition in the gas spaces between the optical elements; and alteration of the gas pressure in the gas spaces between the optical elements.

In addition, the catadioptric projection objective can be configured such that the measuring device generates a measurement signal, which is forwarded to an evaluation unit, and the evaluation unit, with the aid of the measurement signal, provides a control signal for driving the correction mechanism. The imaging quality can thereby be rapidly corrected if an alteration occurs for example on account of heating of optical elements. From the measurement signal of the measuring device, the evaluation unit determines what correction mechanism has to be driven to what extent in order to achieve a suitable compensation. The control signal made available allows near-instantaneous driving, such that the exposure of the photosensitive layer ideally does not have to be interrupted. At the same time, on account of the continuous measurement with the aid of the measuring device, the evaluation unit can immediately check the effect of the correction mechanism and, if desired, provides an adapted control signal.

Imaging radiation having a wavelength of 193 nm is often used in catadioptric projection objectives. This wavelength has the advantage that, firstly, it is relatively low, such that a good resolution of the imaging is achieved, and, secondly, known materials such as quartz or $CaF_2$ can be used in the projection objective without the imaging radiation being absorbed to an excessively great extent.

A microlithography projection exposure apparatus including a catadioptric projection objective according to the disclosure has the advantages explained above with reference to the projection objective.

The disclosure furthermore relates to a method for measuring the intensity of imaging radiation at the location of a reflective optical component within a catadioptric projection objective for imaging an object field onto an image field with the imaging radiation. In this method, the intensity is measured with a measuring device, wherein, during the operation of the projection objective, a first part of the imaging radiation is reflected and a second part of the imaging radiation is transmitted. The reflected, first part of the imaging radiation at least partly contributes to the imaging of the object field, whereas the transmitted, second part of the imaging radiation is at least partly fed to the measuring device. This has the advantage that the intensity distribution of the reflected first part of the imaging radiation can be deduced directly from the intensity distribution of the transmitted second part of the imaging radiation. It is therefore possible, with the aid of this method, to measure the intensity distribution of the reflected first part of the radiation without feeding the first part to a measuring device.

In one embodiment of the method according to the disclosure, the measurement of the intensity via the imaging radiation takes place simultaneously with an exposure of a photosensitive layer at the location of the image plane. This has the advantage that the imaging radiation used for the exposure is simultaneously measured, such that possible system alterations, for example as a result of heating, are immediately registered and can be correspondingly compensated for without the exposure process having to be interrupted.

BRIEF DESCRIPTION OF THE DRAWINGS

The disclosure will be explained in greater detail with reference to the drawings, in which.

DETAILED DESCRIPTION

Figure 1:
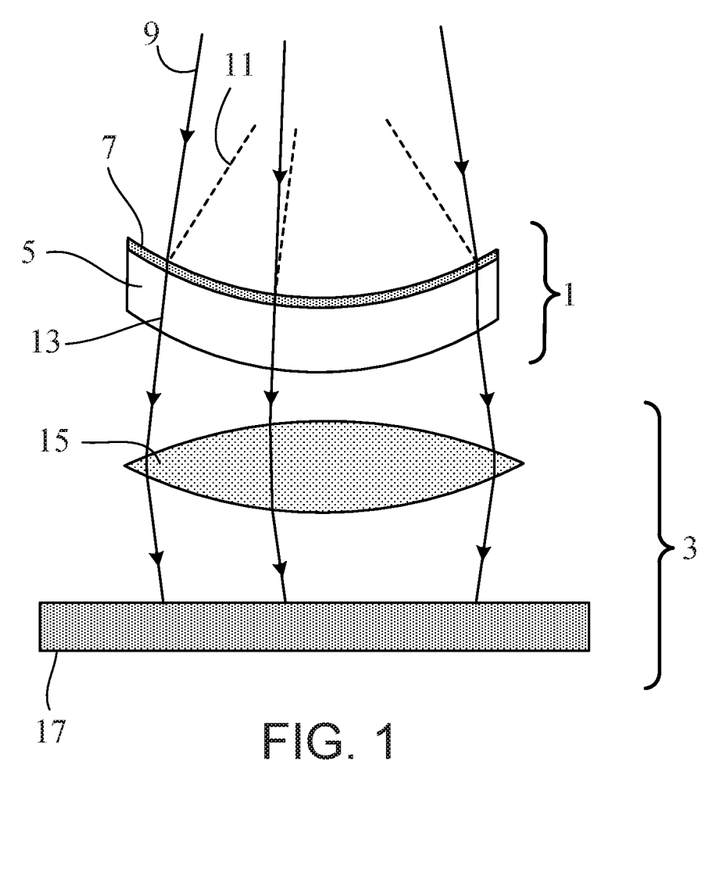
FIG. 1 shows a first embodiment of a reflective optical element according to the disclosure with a measuring device.

The reference signs have been chosen such that objects illustrated in FIG. 1 have been provided with single-digit or two-digit numerals. The objects illustrated in the further figures have reference signs having three or more digits, wherein the last two digits indicate the object and the preceding digits indicate the number of the figure in which the object is illustrated. Therefore, the reference numerals of identical objects illustrated in a plurality of figures correspond in terms of the last two digits. By way of example, the reference signs 3, 303 and 403 identify the measuring device in FIGS. 1, 3 and 4A-4B.

FIG. 1 illustrates a first embodiment of a reflective optical component 1 according to the disclosure with a measuring device 3. In this case, the reflective optical component 1 includes a substrate 5 and a reflective coating 7. Imaging radiation 9 impinges on the reflective optical component 1, of which radiation a first part 11 is reflected and a second part 13 is transmitted. In the present case, the substrate 5 is at least partly transparent to the transmitted second portion 13 of the imaging radiation, such that the transmitted second portion 13 penetrates through the reflective optical component 1 and is fed to a measuring device 3. Alternatively, it is also conceivable for the measuring device 3 to be integrated directly into the reflective optical component 1. In the embodiment illustrated, the measuring device 3 includes a measuring optical unit 15 and a sensor 17. The measuring optical unit 15 is indicated schematically in the form of a convex lens in FIG. 1. Suitable measuring optical units 15 can be found depending on the design of the measuring device 3. Thus, it may be desirable to arrange the sensor 17 at a certain distance from the remaining components in order to be able to replace it more simply as desired. In such a case, the measuring optical unit 15 is embodied such that the distance is bridged. The sensor 17 can be e.g. a semiconductor detector; e.g. MOS-diodes, Schottky-diodes, photodiodes or phototransistors are possible here. Alternatively, the sensor 17 can also be configured such that it does not directly detect the transmitted second portion 13 of the imaging radiation, but rather a secondary effect caused by the imaging radiation. Thus, e.g. heating can be detected by the sensor 17 being configured in the form of one or a plurality of thermistors. In one preferred embodiment, the sensor 17 is divided into a plurality of regions, with the result that a spatially resolved measurement of the transmitted second portion 13 of the imaging radiation is made possible. The measuring optical unit 15 can be designed to fulfill various further functions. Firstly, a distortion correction can be achieved with the aid of the measuring optical unit 15, such that the intensity distribution on the reflective optical component 1 is imaged well onto the sensor 17. Furthermore, the position of the reflective optical component 1 within the catadioptric projection objective can be compensated for with the aid of the measuring optical unit 15. Thus, it is particularly advantageous if the intensity distribution of the imaging radiation in a pupil plane of the catadioptric projection objective can be measured with the aid of the measuring device 3. This can be achieved particularly well when the reflective optical component 1 is arranged near a pupil plane of the projection objective. However, if the projection optical unit is configured such that the reflective optical component is not arranged near a pupil plane, then the measuring optical unit 15 can be embodied in such a way that the sensor 17 is nevertheless arranged near a pupil plane or an optically conjugate pupil plane. The same correspondingly holds true if the intensity distribution in a field plane of the catadioptric projection objective is intended to be measured using the measuring device according to the disclosure. In other words, even though the reflective optical component 1 is not arranged near a field plane of the catadioptric projection objective, with suitable embodiment of the measuring optical unit 15 the sensor 17 can nevertheless be arranged near a field plane or an optically conjugate field plane. In the case of such an embodiment, this likewise makes it possible to measure the intensity distribution in a field plane of the catadioptric projection objective.

The reflective coating 7 can be embodied in a wide variety of types. The transmitted second portion 13 of the imaging radiation has different magnitudes depending on the type of reflective coating 7. It is particularly advantageous if the transmitted second portion 13 on the one hand is as small as possible, because the reflected second portion 11 used for the exposure of the photosensitive substrate is then as large as possible, and on the other hand is large enough to ensure a good measurement with the aid of the measuring device 3. Therefore, a suitable transmission T of the reflective coating 7 can be calculated from the properties of the photosensitive layer and the measuring device.

The following holds true for the surface power density p of the radiation upon passage through the layer:

$$\rho_{incident} \cdot T = \rho_{transmitted} \text{ and } \rho_{incident} \cdot (1-T) = \rho_{reflected},$$

absorption in the reflective coating having been disregarded.

The following therefore results:

$$\rho_{reflected} \cdot \frac{T}{1-T} = \rho_{transmitted}.$$

In order to achieve an exposure of the photosensitive layer, a surface energy density $$\rho_{image} = 0.6 \frac{W}{cm^2}$$

over a typical exposure time of $\tau_{image}$=50 ms is used.

The surface power density $\rho_{image}$ differs from the surface power density of the reflected radiation firstly in that only a certain proportion L reaches the image plane on account of absorption at further optical elements (in the embodiment according to FIG. 2, L is approximately 80%), and secondly in that the size of the illumination differs on account of the optical effect of the interposed optical elements. While approximately a region of $A_{image}$=26 mm·5 mm=130 mm² is illuminated in the image plane, the size of the illumination at the location of the reflective optical element is given by the size of the reflective optical element multiplied by the percentage Q of the illuminated area:

$$A_{optical\ area} \cdot Q$$

This results in the following:

$$\rho_{reflected} = \frac{\rho_{image} \cdot A_{image}}{L \cdot A_{optical\ area} \cdot Q}.$$

Figure 2:
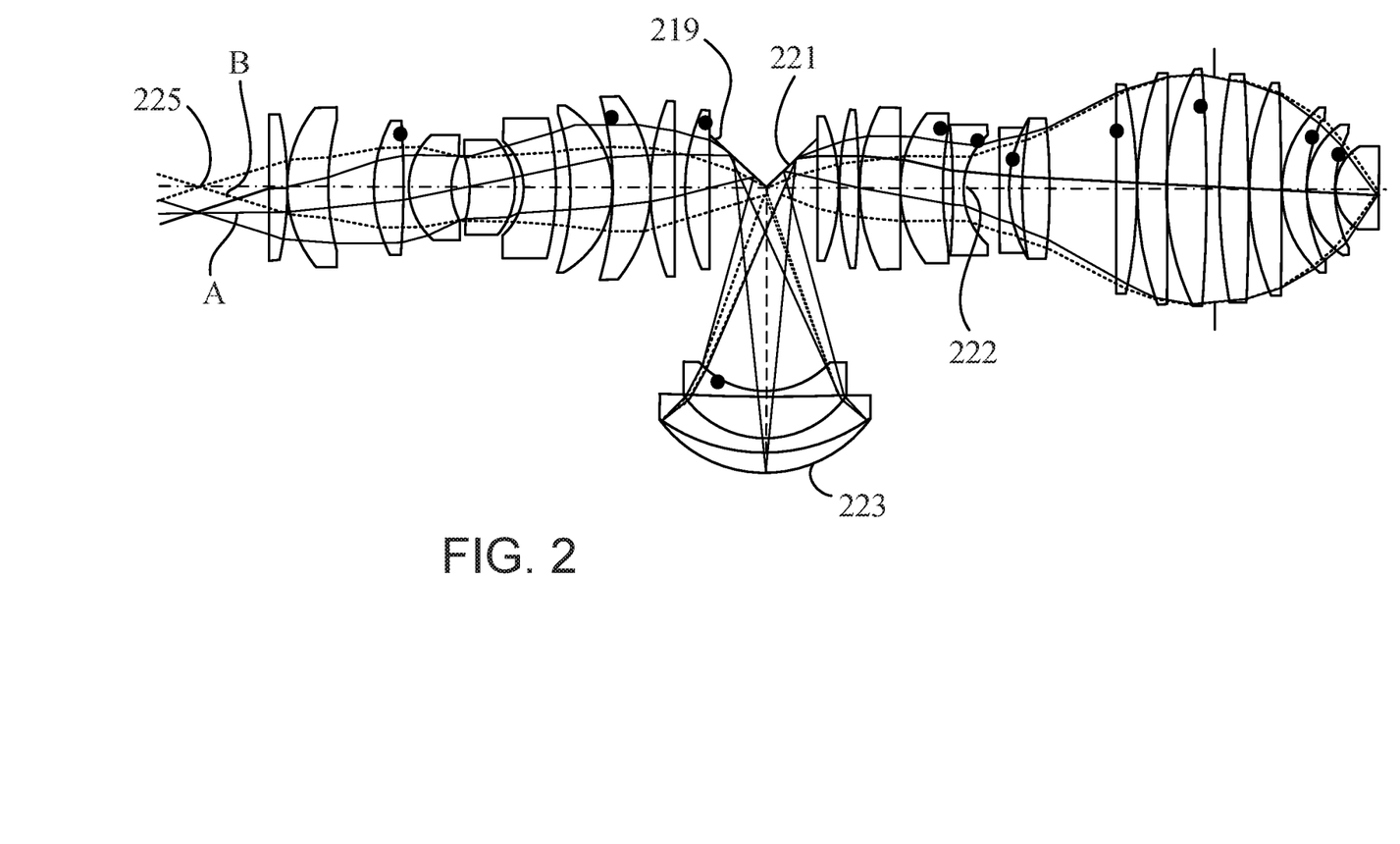
FIG. 2 shows a lens section of a catadioptric projection objective in which the measuring device according to the disclosure can be used.

For the exemplary embodiment in accordance with FIG. 2, the optical area is $A_{optical\ area} \approx 43744$ mm²

Accordingly, the transmitted surface power density can be determined from the properties of the sensor, in which case it is taken into account that the measuring optical unit possibly alters the surface power density by virtue of the fact that, firstly, it exhibits an absorption and, secondly, it concentrates the transmitted second portion 13 of the imaging radiation onto a smaller region. The following thus holds true:

$$\rho_{sensor} = \rho_{transmitted} \cdot R$$

where R is dependent on the exact configuration of the measuring optical unit 15. A typical semiconductor sensor is divided into pixels that are then triggered if an energy of approximately $E_{sensor}$=4.3·10⁻¹² J is applied to them over a time period $\tau_{sensor}$ of typically 10 ms. If such a pixel has a size of approximately 9 μm×9 μm=81·10⁻⁶ cm², this results in a surface power density $$\rho_{sensor} \approx 5.3 \cdot 10^{-5} \frac{W}{cm^2}.$$

This results in the following overall for the transmission:

$$\frac{\rho_{sensor}}{R} = \frac{T}{1-T} \frac{\rho_{image} \cdot A_{image}}{L \cdot A_{optical\ area} \cdot Q}$$

As an estimation for the transmission, it can be assumed that R=1 and that Q=1 holds true, that is to say that the surface power of the transmitted second portion 13 is distributed over a sensor area having exactly the same size as the area of the reflective optical component. This results in the following:

$$T = \left(1 + \frac{\rho_{image} \cdot A_{image}}{L \cdot \rho_{sensor} A_{optical\ area}}\right)^{-1} \approx 2.3\%$$

If, in specific applications, only a partial region of the reflective optical component 1 is illuminated or the measuring optical unit is embodied in concentrating fashion, thus resulting in R<1, it is even the case that a significantly lower transmission is used.

Various forms of coatings can be used as the reflective coating 7, wherein the type of coating is dependent on the wavelength of the imaging radiation and the magnitude of the angles of incidence on the reflective optical component.

Given angles of incidence in the range of 30° to 60°, as occur for example in the case of the two folding mirrors 219 and 221 in the exemplary embodiment according to FIG. 2, and a wavelength of 193 nm, it is possible to use, for example, a two-layered coating composed of aluminum and aluminum oxide. The exact layer configuration is presented in Table 1. A transmission of 1% and a reflectivity of more than 90% for the angle-of-incidence spectrum 30° to 60° result for this coating.

TABLE 1

|  | Thickness [nm] | Material | n(193 nm) | k(193 nm) |
|---|---|---|---|---|
| Substrate |  | fused silica | 1.552 | 0 |
| 1 | 34.9 | Al | 0.113 | 2.204 |
| 2 | 42.1 | Al2O3 | 1.85 | 0.006 |
| Surroundings |  |  |  |  |

In the case of a smaller angle-of-incidence spectrum in the range of 40° to 50° it is possible to use dielectric layer designs in which the coatings consist of a whole series of different alternating layers. Table 2 shows one example of such a coating, having a transmission of 2% and a reflectivity of more than 95% for incident imaging radiation with angles of incidence in the range of 40° to 50°.

TABLE 2

|  | Thickness [nm] | Material | n(193 nm) | k(193 nm) |
|---|---|---|---|---|
| Substrate |  | fused silica | 1.552 | 0 |
| 1 | 27.5 | Al2O3 | 1.850 | 0.004 |
| 2 | 41.0 | MgF2 | 1.44 | 0.0002 |
| 3 | 23.0 | Al2O3 | 1.850 | 0.004 |
| 4 | 86.5 | MgF2 | 1.44 | 0.0002 |
| 5 | 21.6 | Al2O3 | 1.850 | 0.004 |
| 6 | 42.1 | MgF2 | 1.44 | 0.0002 |
| 7 | 26.8 | Al2O3 | 1.850 | 0.004 |
| 8 | 39.7 | MgF2 | 1.44 | 0.0002 |
| 9 | 28.1 | Al2O3 | 1.850 | 0.004 |
| 10 | 38.8 | MgF2 | 1.44 | 0.0002 |
| 11 | 28.7 | Al2O3 | 1.850 | 0.004 |
| 12 | 38.4 | MgF2 | 1.44 | 0.0002 |
| 13 | 29.0 | Al2O3 | 1.850 | 0.004 |
| 14 | 38.2 | MgF2 | 1.44 | 0.0002 |
| 15 | 29.2 | Al2O3 | 1.850 | 0.004 |
| 16 | 38.1 | MgF2 | 1.44 | 0.0002 |
| 17 | 29.3 | Al2O3 | 1.850 | 0.004 |
| 18 | 38.1 | MgF2 | 1.44 | 0.0002 |
| 19 | 29.4 | Al2O3 | 1.850 | 0.004 |
| 20 | 38.1 | MgF2 | 1.44 | 0.0002 |
| 21 | 29.5 | Al2O3 | 1.850 | 0.004 |
| 22 | 38.1 | MgF2 | 1.44 | 0.0002 |
| 23 | 29.5 | Al2O3 | 1.850 | 0.004 |
| 24 | 38.3 | MgF2 | 1.44 | 0.0002 |
| 25 | 29.6 | Al2O3 | 1.850 | 0.004 |
| 26 | 38.6 | MgF2 | 1.44 | 0.0002 |
| 27 | 29.8 | Al2O3 | 1.850 | 0.004 |
| 28 | 39.5 | MgF2 | 1.44 | 0.0002 |
| 29 | 30.0 | Al2O3 | 1.850 | 0.004 |
| 30 | 42.0 | MgF2 | 1.44 | 0.0002 |
| 31 | 28.7 | Al2O3 | 1.850 | 0.004 |
| 32 | 8.0 | MgF2 | 1.44 | 0.0002 |
| Surroundings |  |  |  |  |

In an alternative embodiment, the reflective optical component can also be used for a concave mirror on which imaging radiation impinges with angles of incidence of between 0° and 30°. This is, for example, the mirror 223 in the embodiment according to FIG. 2. In such a case, a different layer design results, which is shown in detail in Table 3. For such a coating, the transmission is approximately 2% and the reflectivity is greater than 95% for radiation with angles of incidence in the range of 0° to 30°.

TABLE 3

|  | Thickness [nm] | Material | n(193 nm) | k(193 nm) |
|---|---|---|---|---|
| Substrate |  | fused silica | 1.552 | 0 |
| 1 | 25.0 | Al2O3 | 1.850 | 0.004 |
| 2 | 50.2 | MgF2 | 1.44 | 0.0002 |
| 3 | 46.4 | Al2O3 | 1.850 | 0.004 |
| 4 | 35.3 | MgF2 | 1.44 | 0.0002 |
| 5 | 25.4 | Al2O3 | 1.850 | 0.004 |
| 6 | 34.2 | MgF2 | 1.44 | 0.0002 |
| 7 | 26.7 | Al2O3 | 1.850 | 0.004 |
| 8 | 33.8 | MgF2 | 1.44 | 0.0002 |
| 9 | 27.2 | Al2O3 | 1.850 | 0.004 |
| 10 | 33.6 | MgF2 | 1.44 | 0.0002 |
| 11 | 27.5 | Al2O3 | 1.850 | 0.004 |
| 12 | 33.4 | MgF2 | 1.44 | 0.0002 |
| 13 | 27.6 | Al2O3 | 1.850 | 0.004 |
| 14 | 33.3 | MgF2 | 1.44 | 0.0002 |
| 15 | 27.8 | Al2O3 | 1.850 | 0.004 |
| 16 | 33.1 | MgF2 | 1.44 | 0.0002 |
| 17 | 28.0 | Al2O3 | 1.850 | 0.004 |
| 18 | 32.9 | MgF2 | 1.44 | 0.0002 |
| 19 | 28.2 | Al2O3 | 1.850 | 0.004 |
| 20 | 32.4 | MgF2 | 1.44 | 0.0002 |
| 21 | 28.8 | Al2O3 | 1.850 | 0.004 |
| 22 | 31.1 | MgF2 | 1.44 | 0.0002 |
| 23 | 30.1 | Al2O3 | 1.850 | 0.004 |
| 24 | 27.4 | MgF2 | 1.44 | 0.0002 |
| 25 | 39.2 | Al2O3 | 1.850 | 0.004 |
| Surroundings |  |  |  |  |

FIG. 2 shows a detailed illustration of a catadioptric projection objective in which the measuring device and reflective optical component according to the disclosure can be used. Such a projection objective is known from WO2004/01928. The explicit design data of this projection objective are presented in Tables 4 and 5. The black dots in the figure mark rotationally symmetrical aspherical surfaces that are described by the equation $$Z = \frac{(CURV)Y^2}{1+(1-(1+K)(CURV)^2Y^2)^{\frac{1}{2}}} + (C1)Y^4 + (C2)Y^6 + (C3)Y^8 + (C4)Y^{10} + (C5)Y^{12} + (C6)Y^{14} + (C7)Y^{16} + (C8)Y^{18} + (C9)Y^{20}$$

where Y denotes the distance from the axis of rotation, which coincides with the optical axis 227 of the projection objective. The curvature CURV corresponds to the reciprocal of the radius indicated in Table 4.

The catadioptric projection objective includes two deflection mirrors 219 and 221 and one concave mirror 223, which can in each case be embodied as a reflective optical component with measuring device.

FIG. 2 furthermore shows the imaging beam path for elucidating the terms near the pupil and near the field. In this case, the paraxial principal ray A is illustrated for the axially furthest point that is imaged and the paraxial marginal ray B is illustrated for the axial point. A definition of the paraxial marginal ray and paraxial principal ray is given in "Fundamental Optical Design" by Michael J. Kidger, SPIE PRESS, Bellingham, Wash., USA, which is incorporated by reference herein. If $y_i$ denotes the distance between the point of intersection of the paraxial marginal ray with the i-th optical surface and the optical axis and $\bar{y}_i$ denotes the corresponding point of intersection of the paraxial principal ray, then for each surface it is possible to calculate the paraxial subaperture ratio, which is given by:

$$\text{sign}(y_i)\frac{\bar{y}_i}{|\bar{y}_i|+|y_i|}$$

On the basis of the paraxial subaperture ratio it is possible to determine whether an optical surface is near the field or near the pupil. For optical elements within the folded branch 231, the corresponding folded optical axis should be used as a reference. For pupil planes it holds true that $\bar{y}_i=0$, and so the paraxial subaperture ratio vanishes. In the case of field planes it holds true that $y_i=0$ and that the paraxial subaperture ratio thus has an absolute value equal to 1. Within the meaning of this application, planes near the pupil denote all planes whose paraxial subaperture ratio has an absolute value of less than 0.5. By contrast, planes near the field are understood to be all planes whose paraxial subaperture ratio has an absolute value of greater than 0.5. For the concave mirror 223, for example, $\bar{y}_i=0$ holds true. Consequently, the mirror is situated in a pupil plane. By contrast, a paraxial subaperture ratio of $$\text{sign}(14.630)\frac{61.080}{|61.080|+|14.630|} = 0.806$$

arises for the deflection mirror 219 and a paraxial subaperture ratio of $$\text{sign}(18.678)\frac{-61.488}{|-61.488|+|18.678|} = 0.767$$

arises for the deflection mirror 221.

Both deflection mirrors are therefore near the field.

According to the disclosure, both the concave mirror 223 and one or both of the deflection mirrors 219 and 221 can be equipped with a measuring device, as described with reference to FIG. 1. An illustration in FIG. 2 has been dispensed with for reasons of clarity. The measuring device according to the disclosure makes it possible to continuously measure the intensity distribution of the imaging radiation during the exposure process. From these measurement data and the mechanical and optical properties of the projection objective, it is possible to determine, on the basis of known models with regard to element heating and material damage, what temperature distribution and what material alteration are present at the optical elements at the point in time of the measurement. Wavefront aberrations at the location of the image field can in turn be determined therefrom, such that the correction of the imaging properties can be performed with the aid of a wide variety of correction mechanisms. Alternatively or supplementarily to this, the measurement data can be compared with calibration measurements carried out previously under different standardized operating conditions and suitable settings of the correction mechanism can be determined by interpolation or extrapolation from the wavefront aberrations measured in this case.

Possible correction mechanisms which can be used in a catadioptric projection objective include:

alteration of the imaging wavelength by suitable modification of the light source, such as, for example, changing the pressure in the laser resonator, or modifying a spectral filter used;

optical elements which are displaceable along the optical axis of the system;

optical elements which are displaceable perpendicularly to the optical axis of the system;

optical elements which are tiltable about an axis that is orthogonal to the optical axis of the system;

non-rotationally symmetrically aspherized elements which are rotatable about the optical axis of the system (Alvarez manipulator);

oppositely shaped optical elements displaceable relative to one another, preferably aspherized plane plates (Alvarez manipulator);

deformable optical elements, in particular adaptive mirrors;

locally heatable and/or coolable optical elements, for example with the aid of infrared radiation;

globally heatable or coolable optical elements, such as e.g. an immersion liquid;

alteration of the gas composition in the gas spaces between the optical elements; and alteration of the gas pressure in the gas spaces between the optical elements.

All these correction mechanisms can be connected to an evaluation unit, which receives a measurement signal from the measuring device and generates therefrom a control signal for driving the correction mechanisms.

TABLE 4

Optical data of the catadioptric projection objective according to Figure 2
NA: 1.25 Wavelength: 193.3 nm
26 mm × 4 mm beta: 0.25

| Surface number | Radius | Thickness/ distance | Medium | Refractive index at 193.37 nm | 1/2 free diameter |
| --- | --- | --- | --- | --- | --- |
| 0 | 0.000000 | 81.909100 | | 1.0000000 | 60.033 |
| 1 | 2634.494170 | 21.250400 | SIO2 | 1.5603261 | 84.607 |
| 2 | −395.771680 | 1.000000 | | 1.0000000 | 86.438 |
| 3 | 150.000000 | 50.000000 | SIO2 | 1.5603261 | 93.055 |
| 4 | 369.687330 | 54.915200 | | 1.0000000 | 87.911 |
| 5 | 179.714460 | 34.086800 | SIO2 | 1.5603261 | 79.061 |
| 6 | −477.803632 | 6.693200 | | 1.0000000 | 75.808 |
| 7 | 88.938160 | 50.000000 | SIO2 | 1.5603261 | 61.395 |
| 8 | 91.869190 | 23.605900 | | 1.0000000 | 41.199 |
| 9 | −98.632420 | 50.000000 | SIO2 | 1.5603261 | 38.263 |

TABLE 4-continued

Optical data of the catadioptric projection objective according to Figure 2
NA: 1.25 Wavelength: 193.3 nm
26 mm × 4 mm beta: 0.25

| Surface number | Radius | Thickness/ distance | Medium | Refractive index at 193.37 nm | 1/2 free diameter |
|---|---|---|---|---|---|
| 10 | −88.506390 | 12.049500 |  | 1.0000000 | 54.125 |
| 11 | −76.470080 | 38.657300 | SIO2 | 1.5603261 | 55.652 |
| 12 | −344.460330 | 15.702800 |  | 1.0000000 | 81.919 |
| 13 | −334.926670 | 50.066100 | SIO2 | 1.5603261 | 90.780 |
| 14 | −117.238730 | 1.000000 |  | 1.0000000 | 96.774 |
| 15 | −395.286603 | 43.871600 | SIO2 | 1.5603261 | 102.141 |
| 16 | −181.497120 | 1.000000 |  | 1.0000000 | 106.823 |
| 17 | 289.196280 | 27.848300 | SIO2 | 1.5603261 | 102.338 |
| 18 | 5892.122010 | 12.151700 |  | 1.0000000 | 100.491 |
| 19 | 227.013620 | 27.157000 | SIO2 | 1.5603261 | 91.787 |
| 20 | 3443.763345 | 69.000000 |  | 1.0000000 | 88.482 |
| 21 | 0.000000 | −236.511600 |  | −1.0000000 | 93.010 |
| 22 | 107.026046 | −12.500000 | SIO2 | −1.5603261 | 77.379 |
| 23 | 1144.459840 | −50.132600 |  | −1.0000000 | 93.528 |
| 24 | 110.859760 | −12.500000 | SIO2 | −1.5603261 | 94.408 |
| 25 | 213.248200 | −26.158800 |  | −1.0000000 | 121.413 |
| 26 | 155.158660 | 26.158800 |  | 1.0000000 | 124.079 |
| 27 | 213.248200 | 12.500000 | SIO2 | 1.5603261 | 121.279 |
| 28 | 110.859760 | 50.132600 |  | 1.0000000 | 94.366 |
| 29 | 1144.459840 | 12.500000 | SIO2 | 1.5603261 | 93.590 |
| 30 | 107.026046 | 236.511600 |  | 1.0000000 | 78.711 |
| 31 | 0.000000 | −64.048900 |  | −1.0000000 | 80.845 |
| 32 | 3037.951580 | −22.331200 | SIO2 | −1.5603261 | 81.395 |
| 33 | 259.310450 | −1.000000 |  | −1.0000000 | 84.258 |
| 34 | −470.923230 | −24.545000 | SIO2 | −1.5603261 | 91.158 |
| 35 | 700.750920 | −1.000000 |  | −1.0000000 | 92.143 |
| 36 | −228.288980 | −45.979800 | SIO2 | −1.5603261 | 94.586 |
| 37 | −4362.499070 | −1.000000 |  | −1.0000000 | 91.793 |
| 38 | −147.001560 | −50.000000 | SIO2 | −1.5603261 | 87.420 |
| 39 | −505.438519 | −13.175800 |  | −1.0000000 | 77.709 |
| 40 | 810.594260 | −12.500000 | SIO2 | −1.5603261 | 76.617 |
| 41 | −96.147375 | −40.925200 |  | −1.0000000 | 67.165 |
| 42 | −2113.410760 | −12.500000 | SIO2 | −1.5603261 | 70.138 |
| 43 | −144.960906 | −16.180300 |  | −1.0000000 | 73.606 |
| 44 | −562.313340 | −30.687700 | SIO2 | −1.5603261 | 75.291 |
| 45 | 1126.648250 | −80.233900 |  | −1.0000000 | 81.957 |
| 46 | −3405.414609 | −22.658500 | SIO2 | −1.5603261 | 119.099 |
| 47 | 586.423270 | −1.000000 |  | −1.0000000 | 121.813 |
| 48 | −361.039350 | −33.153400 | SIO2 | −1.5603261 | 134.636 |
| 49 | −3170.027570 | −1.000000 |  | −1.0000000 | 135.165 |
| 50 | −310.029270 | −49.249300 | SIO2 | −1.5603261 | 138.460 |
| 51 | 809.565830 | −9.868200 |  | −1.0000000 | 137.458 |
| 52 | 0.000000 | −5.372200 |  | −1.0000000 | 134.639 |
| 53 | −777.317070 | −35.882400 | SIO2 | −1.5603261 | 133.952 |
| 54 | 1312.612220 | −1.000700 |  | −1.0000000 | 131.798 |
| 55 | −319.735750 | −35.943900 | SIO2 | −1.5603261 | 123.507 |
| 56 | 3225.490720 | −1.000000 |  | −1.0000000 | 120.740 |
| 57 | −130.495300 | −28.495000 | SIO2 | −1.5603261 | 95.630 |
| 58 | −196.7895749 | −1.000000 |  | −1.0000000 | 88.921 |
| 59 | −95.22134 | −34.303600 | SIO2 | −1.5603261 | 76.079 |
| 60 | −216.9390336 | −1.000000 |  | −1.0000000 | 66.955 |
| 61 | −61.85167 | −50.000000 | SIO2 | −1.5603261 | 49.647 |
| 62 | 0 | −1.000000 | H2O | −1.4368163 | 16.616 |
| 63 | 0 | 0.000000 | H2O | −1.4368163 | 15.010 |

TABLE 5

Aspherical constants of the catadioptric projection objective according to Figure 2

| Surface number | 6 | 15 | 20 | 22 | 30 |
|---|---|---|---|---|---|
| K | 0 | 0 | 0 | 0 | 0 |
| C1 | 7.81812000E−08 | −1.14607000E−08 | 1.29530000E−08 | −8.88014000E−08 | −8.88014000E−08 |
| C2 | 6.03387000E−13 | 4.60861000E−13 | 2.79320000E−13 | −3.40911000E−12 | −3.40911000E−12 |
| C3 | 3.16794000E−16 | −1.61766000E−17 | −1.95862000E−17 | −1.98985000E−16 | −1.98985000E−16 |
| C4 | −3.45599000E−20 | −5.41414000E−24 | 6.49032000E−22 | −1.45801000E−20 | −1.45801000E−20 |
| C5 | 1.67268000E−24 | 5.36076000E−27 | −1.02409000E−26 | −9.23066000E−26 | −9.23066000E−26 |
| C6 | 0.00000000E+00 | −1.16131000E−31 | −4.06450000E−32 | −1.30730000E−28 | −1.30730000E−28 |

TABLE 5-continued

Aspherical constants of the catadioptric projection objective according to Figure 2

| | | | | | |
|---|---|---|---|---|---|
| C7 | 0.00000000E+00 | 0.00000000E+00 | 0.00000000E+00 | 0.00000000E+00 | 0.00000000E+00 |
| C8 | 0.00000000E+00 | 0.00000000E+00 | 0.00000000E+00 | 0.00000000E+00 | 0.00000000E+00 |
| C9 | 0.00000000E+00 | 0.00000000E+00 | 0.00000000E+00 | 0.00000000E+00 | 0.00000000E+00 |

| Surface number | 39 | 41 | 43 | 46 | 51 |
|---|---|---|---|---|---|
| K | 0 | 0 | 0 | 0 | 0 |
| C1 | −3.21829000E−08 | −1.40846000E−08 | 3.76564000E−08 | 1.54429000E−08 | −9.78469000E−09 |
| C2 | 4.08976000E−13 | 3.73235000E−12 | 2.04565000E−12 | −1.52631000E−13 | 2.15545000E−14 |
| C3 | 9.46190000E−17 | 5.78170000E−17 | 6.72661000E−17 | −1.17235000E−17 | −2.66488000E−17 |
| C4 | −1.12686000E−20 | 4.02044000E−20 | 3.35779000E−21 | −3.02626000E−22 | 1.19902000E−21 |
| C5 | 1.09349000E−24 | 1.81116000E−24 | −5.51576000E−25 | −2.05070000E−28 | −2.50321000E−26 |
| C6 | −2.30304000E−29 | −3.46502000E−28 | 2.95829000E−28 | 3.61487000E−31 | 2.10016000E−31 |
| C7 | 0.00000000E+00 | 0.00000000E+00 | 0.00000000E+00 | 0.00000000E+00 | 0.00000000E+00 |
| C8 | 0.00000000E+00 | 0.00000000E+00 | 0.00000000E+00 | 0.00000000E+00 | 0.00000000E+00 |
| C9 | 0.00000000E+00 | 0.00000000E+00 | 0.00000000E+00 | 0.00000000E+00 | 0.00000000E+00 |

| Surface number | 58 | 60 |
|---|---|---|
| K | 0 | 0 |
| C1 | 2.76215000E−09 | −1.08228000E−07 |
| C2 | −4.06793000E−12 | −9.51194000E−12 |
| C3 | 4.51389000E−16 | 1.14605000E−15 |
| C4 | −5.07074000E−20 | −1.27400000E−19 |
| C5 | 1.83976000E−24 | 1.59438000E−23 |
| C6 | −6.22513000E−29 | −5.73173000E−28 |
| C7 | 0.00000000E+00 | 0.00000000E+00 |
| C8 | 0.00000000E+00 | 0.00000000E+00 |
| C9 | 0.00000000E+00 | 0.00000000E+00 |

Figure 3:
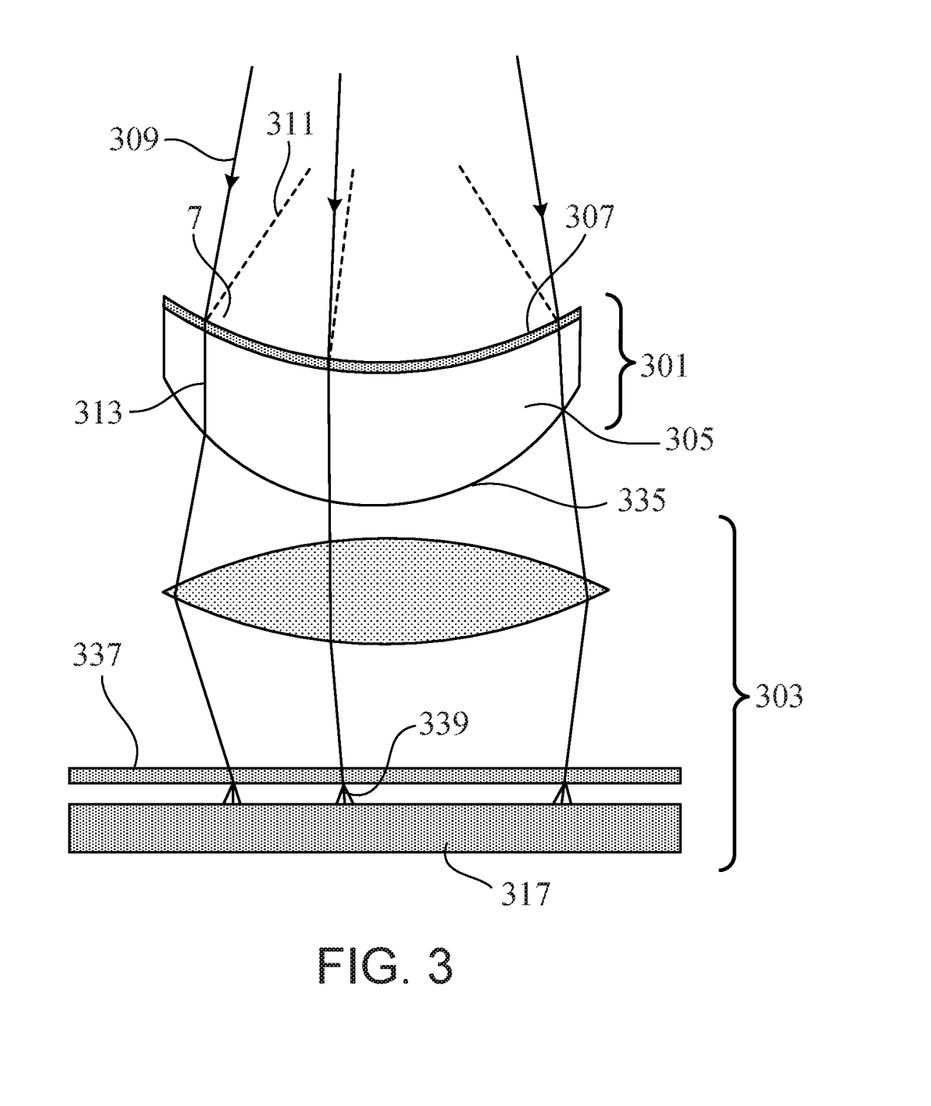
FIG. 3 shows an embodiment of a measuring device according to the disclosure.

FIG. 3 shows a further embodiment of the reflective optical component according to the disclosure. In this embodiment, the substrate of the reflective optical component 301 is developed in such a way that the rear side 335 of the substrate deliberately has a form that differs from the form of the front side of the reflective optical component. In this way, for the transmitted second portion 313 of the impinging imaging radiation, it is possible to achieve a targeted optical effect upon leaving the substrate. Consequently, the rear side 335 should actually already be regarded as part of the measuring optical unit 315. The measuring device includes a component 337 that emits a secondary radiation 339 upon passage or absorption of the transmitting, second part 313 of the imaging radiation, wherein the secondary radiation 339 has a different wavelength than the imaging radiation. In the embodiment illustrated, the component is a fluorescent component arranged at a small distance from the sensor 317. What can thereby be achieved is that it is possible to use a sensor 317 which has its maximum sensitivity in the range of the wavelength of the secondary radiation rather than in the range of the wavelength of the imaging radiation.

Figure 4A:
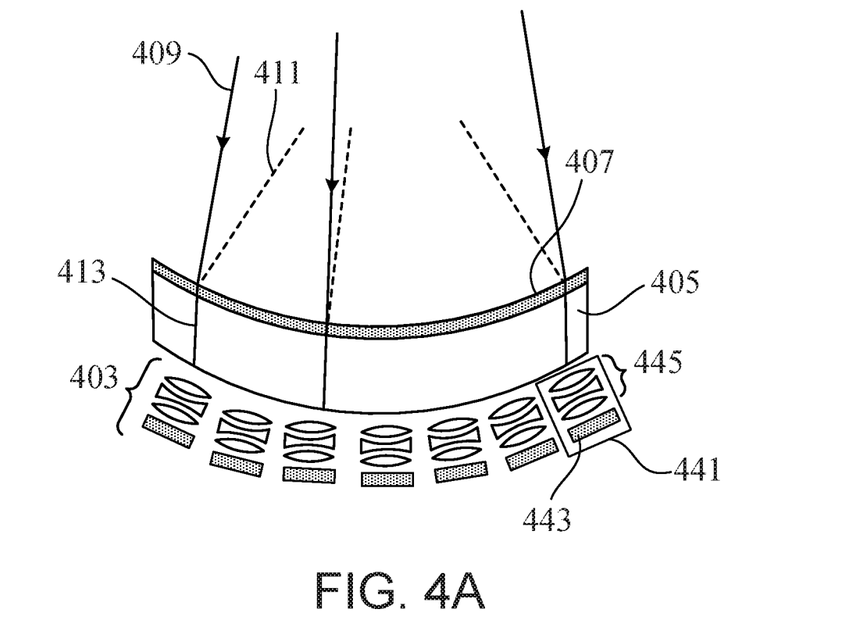
FIG. 4A shows an embodiment of the measuring device according to the disclosure including a plurality of sensor units.

FIG. 4A shows an alternative configuration of the reflective optical component, in which the measuring device is constructed from a plurality of sensor units 441 each including a sensor 443 and a measuring optical unit 445. Such a division in the form of smaller sensor units 441 may be advantageous because individual sensor units can thus be replaced more simply and more cost-effectively in the case of repair.

Figure 4B:
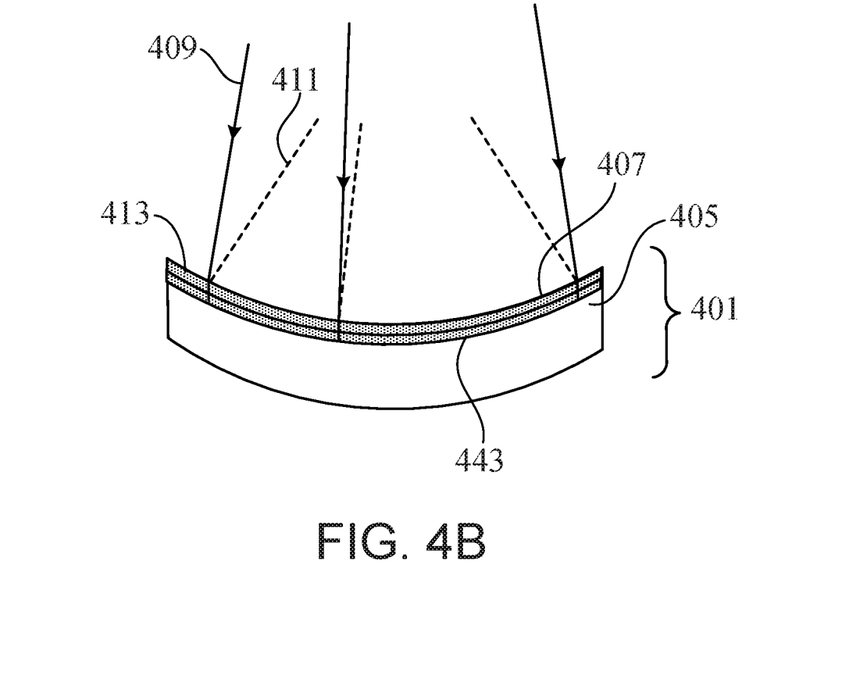
FIG. 4B shows an embodiment in which no further optical components are arranged between reflective coating and radiation-sensitive sensor.

FIG. 4B shows a configuration in which the measuring device includes at least one radiation-sensitive sensor, which is connected directly to the reflective optical component 401. The reflective optical component 401 includes a substrate 405 and a reflective coating 407. The radiation-sensitive sensor 443 is arranged between substrate 405 and reflective coating 407, such that the transmitted, second part 413 of the imaging radiation impinges on the radiation-sensitive sensor 443 without passing through further optical components between the reflective coating 407 and the radiation-sensitive sensor. Absorption of the radiation to be measured within an intervening measuring optical unit can be avoided in this way. In particular, the sensor 443 can be embodied as a semiconductor detector and be embedded directly into a substrate composed of silicon.

Figure 5:
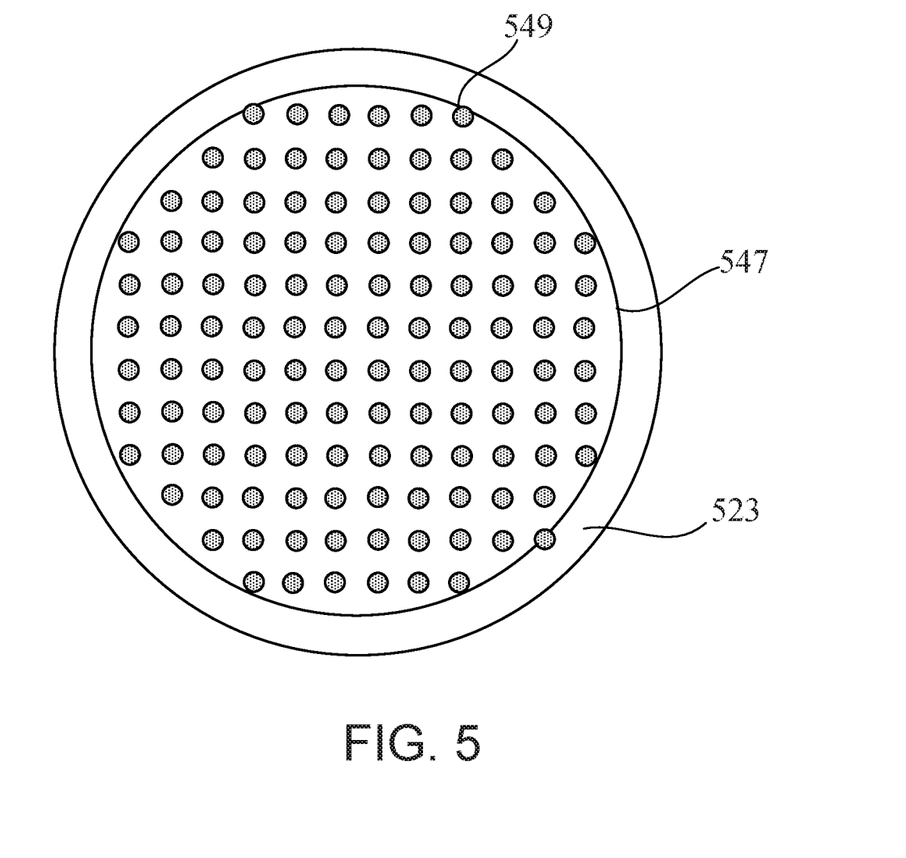
FIG. 5 shows a plan view of the concave reflective optical component of the projection objective in accordance with FIG. 2, wherein the illuminated region has a plurality of partial regions arranged in the form of a regular grid.

FIG. 5 shows a plan view of a reflective optical element with measuring device. This is specifically a plan view of the concave mirror 523 according to the exemplary embodiment illustrated in FIG. 2. During the operation of the projection objective, an illuminated region 547 arises on the concave mirror 523. In the embodiment illustrated, the illuminated region 547 has a plurality of partial regions 549 arranged in the form of a Cartesian grid. In this case, the optical component is configured, for example, with the aid of the coating in such a way that the transmission is greater in the partial regions than outside the partial regions. Consequently, in particular the imaging radiation transmitted at each point of the partial regions is fed to the measuring device situated behind the mirror. Thus, by way of example, each partial region 549 can be assigned to a sensor unit 441 according to FIGS. 4A-4B. Because, for many purposes, it suffices to determine the intensity distribution on a finite number of grid points, it possible to achieve firstly a measurement at the location of the partial regions 549 and secondly a particularly high reflectivity of the reflective optical component, because the zones outside the partial regions do not have reduced reflectivity.

Figure 6:
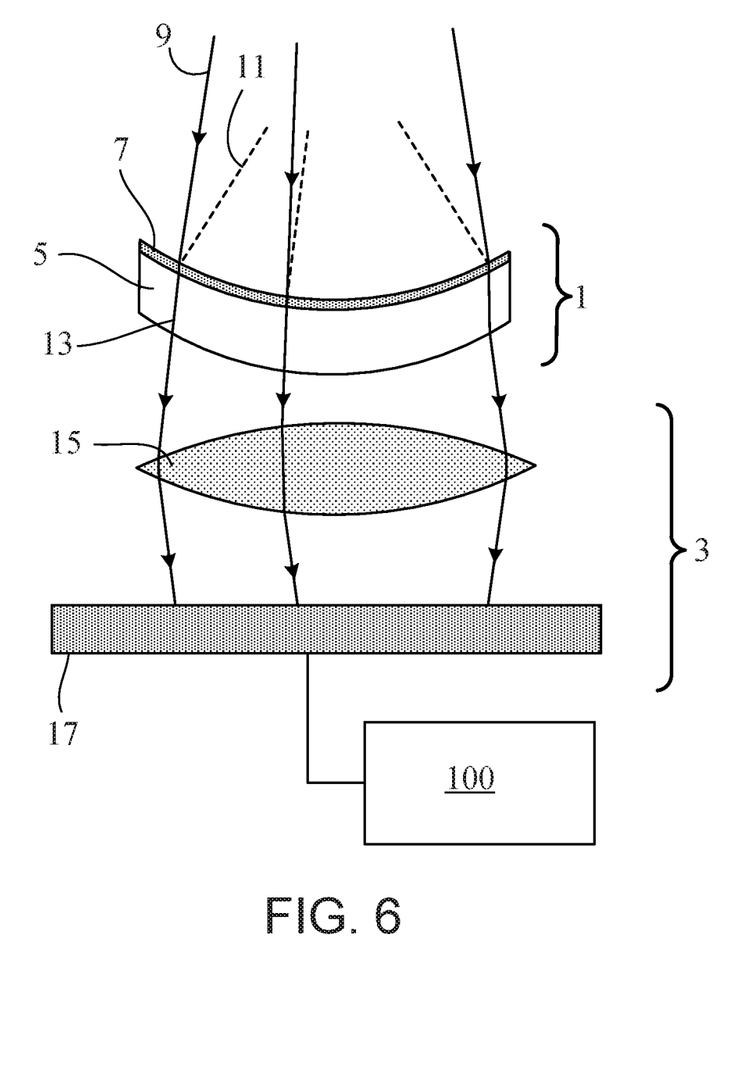
FIG. 6 depicts an embodiment of the reflective optical element of FIG. 1 with an evaluation unit.
Figure 7:
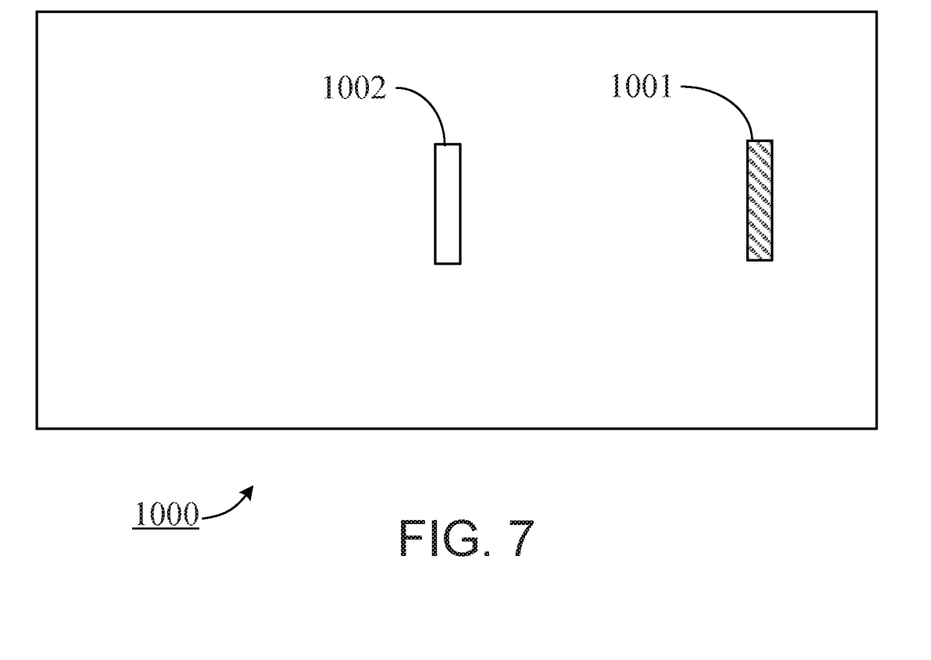
FIG. 7 depicts a projection objective with an exemplary correction mechanism.
Figure 8:
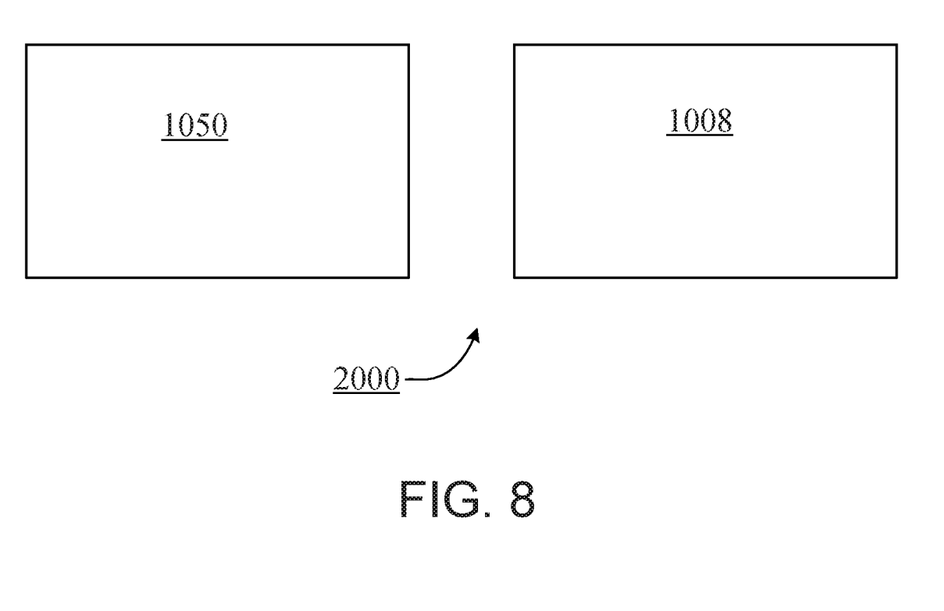
FIG. 8 depicts a projection exposure apparatus including an illumination system and a projection objective.

FIG. 6 shows the embodiment of FIG. 1 with an evaluation unit 100. FIG. 7 shows a projection objective 1000 with an exemplary correction mechanism 1002 in the form of an optical element 1002 which is displaceable along the optical axis of the system. FIG. 7 also shows a photosensitive layer 1001 located in an image plane of projection objective 1000. FIG. 8 shows a projection exposure apparatus 2000 which includes an illumination system 1050 and a projection objective 1008.

What is claimed is:

1. A projection objective configured to image an object field onto an image field via imaging radiation, the projection objective comprising:
    a reflective optical component;
    a measuring device;
    an evaluation unit; and
    a deformable optical element,
    wherein the projection objective is a catadioptric projection objective, and
    wherein during use of the projection objective:
        the reflective optical component reflects a first part of the imaging radiation;
        the reflective optical component transmits a second part of the imaging radiation;
        the reflected, first part of the imaging radiation at least partly contributes to imaging of the object field into the image field;
        the transmitted, second part of the imaging radiation is at least partly fed to the measuring device;
        the transmitted, second part of the imaging radiation is less than 10% of the imaging radiation impinging on the reflective optical component;
        the measuring device generates a measurement signal based on the transmitted, second part of the radiation;
        the measurement signal is forwarded to the evaluation unit; and
        the evaluation unit, with the aid of the measurement signal, provides a control signal to drive the deformable optical element so that the deformable optical element corrects wavefront aberrations of the projection objective.

2. The projection objective of claim 1, wherein the reflective optical component is arranged near a pupil of the projection objective, or the reflective optical component is arranged near a field of the projection objective.

3. The projection objective of claim 1, wherein the reflective optical component has a curvature.

4. The projection objective of claim 1, wherein the transmitted, second part of the imaging radiation is between 0.1% and 5% of the imaging radiation which impinges on the reflective optical component.

5. The projection objective of claim 1, wherein the measuring device comprises a component configured to provide a spatially resolved measurement of an intensity of the transmitted, second part of the imaging radiation.

6. The projection objective of claim 1, wherein during use of the projection objective:
    at least one region of the reflective optical component is illuminated with the imaging radiation; and
    at each point of the at least one region, a part of the imaging radiation is transmitted and fed to the measuring device.

7. The projection objective of claim 1, wherein during use of the projection objective:
    at least one region of the reflective optical element is illuminated with the imaging radiation;
    the at least one region has at least one partial region;
    at each point of the at least one partial region, a part of the imaging radiation is transmitted and fed to the measuring device; and
    outside the at least one partial region, the transmitted, second part of the imaging radiation is less than 0.5% of the imaging radiation which impinges on the reflective optical component.

8. The projection objective of claim 1, wherein the measuring device comprises a measuring optical unit which, during use of the projection objective, directs the transmitted, second part of the imaging radiation onto a radiation-sensitive sensor.

9. The projection objective of claim 1, wherein the reflective optical component comprises a reflective coating, and the measuring device comprises a radiation-sensitive sensor which is directly connected to the reflective optical component so that, during use of the projection objective, the transmitted, second part of the imaging radiation impinges on the radiation-sensitive sensor without passing through further optical components between the reflective coating and the radiation-sensitive sensor.

10. The projection objective of claim 1, wherein the measuring device comprises a component which, during use of the projection objective, emits secondary radiation upon passage or absorption of the transmitted, second part of the imaging radiation, and wherein the secondary radiation has a different wavelength from the imaging radiation.

11. The projection objective of claim 1, wherein the imaging radiation has a wavelength of 193 nm.

12. An apparatus, comprising:
    an illumination system; and
    the projection objective of claim 1,
    wherein the apparatus is a microlithography projection exposure apparatus.

13. The projection objective of claim 1, wherein during use of the projection objective:
    a region of the reflective optical component is illuminated with the imaging radiation;
    the region of the reflective optical component includes a first partial region that is illuminated with the imaging radiation and a second partial region that is illuminated with the imaging radiation;
    the second partial region of the reflective optical component is outside the first partial region of the reflective optical component;
    the first partial region has a first transmittance for the imaging radiation;
    the second partial region has a second transmittance for the imaging radiation;
    the first transmittance is greater than the second transmittance; and
    the region of the reflective optical component transmits a second part of the imaging radiation.

14. A projection objective configured to image an object field onto an image field via imaging radiation, the projection objective comprising:
    a reflective optical component;
    a measuring device;
    an evaluation unit; and
    an adaptive mirror,
    wherein the projection objective is a catadioptric projection objective, and
    wherein during use of the projection objective:
        the reflective optical component reflects a first part of the imaging radiation;
        the reflective optical component transmits a second part of the imaging radiation;
        the reflected, first part of the imaging radiation at least partly contributes to imaging of the object field into the image field;

the transmitted, second part of the imaging radiation is at least partly fed to the measuring device;

the transmitted, second part of the imaging radiation is less than 10% of the imaging radiation impinging on the reflective optical component;

the measuring device generates a measurement signal based on the transmitted, second part of the radiation;

the measurement signal is forwarded to the evaluation unit; and the evaluation unit, with the aid of the measurement signal, provides a control signal to drive the adapative mirror so that the adaptive mirror corrects wavefront aberrations of the projection objective.

15. The projection objective of claim 14, wherein during use of the projection objective:

a region of the reflective optical component is illuminated with the imaging radiation;

the region of the reflective optical component includes a first partial region that is illuminated with the imaging radiation and a second partial region that is illuminated with the imaging radiation;

the second partial region of the reflective optical component is outside the first partial region of the reflective optical component;

the first partial region has a first transmittance for the imaging radiation;

the second partial region has a second transmittance for the imaging radiation;

the first transmittance is greater than the second transmittance; and the region of the reflective optical component transmits a second part of the imaging radiation.

16. The projection objective of claim 14, wherein the reflective optical component is arranged near a pupil of the projection objective, or the reflective optical component is arranged near a field of the projection objective.

17. The projection objective of claim 14, wherein the reflective optical component has a curvature.

18. The projection objective of claim 14, wherein the transmitted, second part of the imaging radiation is between 0.1% and 5% of the imaging radiation which impinges on the reflective optical component.

19. The projection objective of claim 14, wherein the imaging radiation has a wavelength of 193 nm.

20. An apparatus, comprising:

an illumination system; and the projection objective of claim 14, wherein the apparatus is a microlithography projection exposure apparatus.

* * * * *

UNITED STATES PATENT AND TRADEMARK OFFICE
CERTIFICATE OF CORRECTION

PATENT NO. : 10,578,976 B2
APPLICATION NO. : 16/207460
DATED : March 3, 2020
INVENTOR(S) : Sascha Bleidistel et al.

Page 1 of 1

It is certified that error appears in the above-identified patent and that said Letters Patent is hereby corrected as shown below:

In the Specification

Column 7, Line 55, delete "p" and insert -- $\rho$ --;

Column 8, Line 20, after "$A_{optical\,area} \cdot Q$" insert -- . --;

Column 8, Line 28 (approx.), after "mm$^2$" insert -- . --;

Column 8, Line 43, delete "81.10$^{-6}$" and insert -- $81 \cdot 10^{-6}$ --;

Column 8, Lines 54-55, after "$\dfrac{\rho_{sensor}}{R} = \dfrac{T}{1-T} \dfrac{\rho_{image} \cdot A_{image}}{L \cdot A_{optical\,area} \cdot Q}$" insert -- . --;

Column 8, Line 65, after "2.3%" insert -- . --;

Column 11, Line 10, after "$sign(y_i)\dfrac{\overline{y}_i}{|\overline{y}_i|+|y_i|}$" insert -- . --;

In the Claims

Column 19, Line 12, Claim 14, delete "adapative" and insert -- adaptive --.

Signed and Sealed this
Fifth Day of May, 2020

Andrei Iancu
*Director of the United States Patent and Trademark Office*